United States Patent
Colebourn

4,013,961
Mar. 22, 1977

[54] A.M. SIGNAL GENERATOR HAVING AN R.F. OUTPUT LEVEL CONTROL

[75] Inventor: Graham Martin Colebourn, St. Albans, England

[73] Assignee: Marconi Instruments Limited, Chelmsford, England

[22] Filed: July 14, 1975

[21] Appl. No.: 595,343

[30] Foreign Application Priority Data
July 13, 1974 United Kingdom ............ 31138/74

[52] U.S. Cl. ................................. 325/144; 328/151
[51] Int. Cl.² ....................... H04B 1/04; H04B 1/68
[58] Field of Search .......... 325/144, 159, 186, 187; 332/37 R, 37 D, 38; 328/151; 307/235 C, 235 E

[56] References Cited
UNITED STATES PATENTS

| 2,142,335 | 1/1939 | Scott | 325/186 X |
| 3,283,252 | 11/1966 | Mead et al. | 325/186 |
| 3,753,132 | 8/1973 | Hill | 307/235 C X |
| 3,768,024 | 10/1973 | Letosky | 307/235 E X |

*Primary Examiner*—John W. Caldwell
*Assistant Examiner*—William M. Wannisky
*Attorney, Agent, or Firm*—Diller, Brown, Ramik & Wight

[57] ABSTRACT

An A.M. signal generator having an r.f. level control arrangement includes a modulator whose output gain is controllable, a detector for detecting the A.M. wave produced by the modulator and means for sampling and storing the output of the detector at times occurring when the modulating wave passes through a predetermined amplitude level. The sampled and stored signal is then compared with a D.C. voltage and the resultant of the comparison is applied back to the modulator in opposite fashion to variation in the level of the A.M. wave.

9 Claims, 3 Drawing Figures

A.M. SIGNAL GENERATOR HAVING AN R.F. OUTPUT LEVEL CONTROL

This invention relates to A.M. signal generators and more particularly to A.M. signal generators having an r.f. output level control.

It is normally required in an A.M. signal generator to provide an amplitude modulator the output of which is stabilised over a wide range of carrier frequencies and over a wide range of modulating frequencies so that a predetermined amplitude level, usually the mean level of the modulated wave, is maintained substantially constant. The provision of a level control to satisfy this requirement is not without difficulty.

Figure 1:
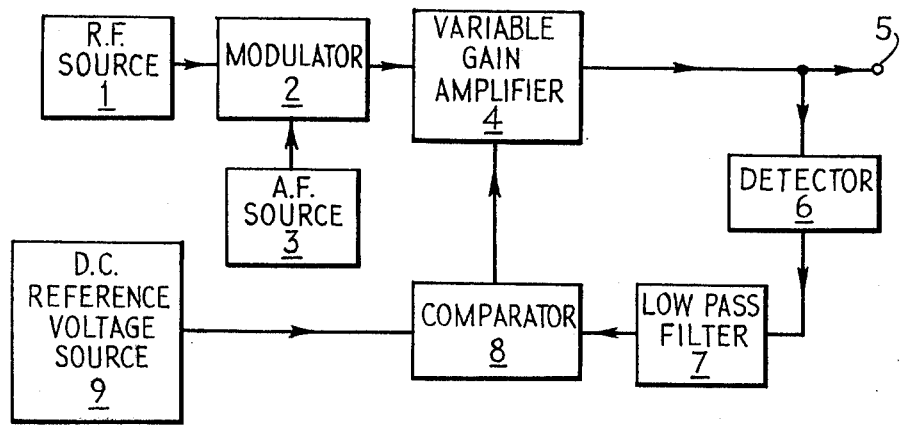

FIG. 1 of the accompanying drawings is a simplified block diagram of a known A.M. signal generator level control arrangement.

Figure 2:
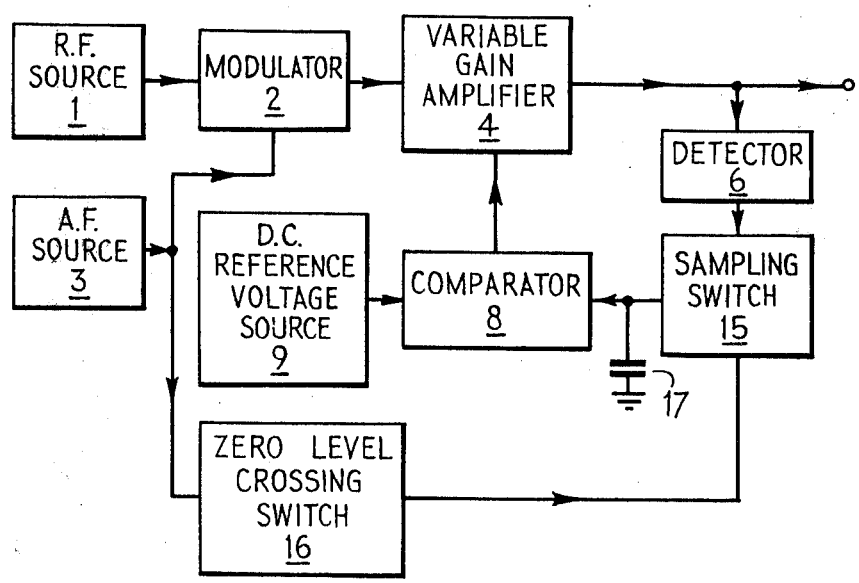
Figure 3:
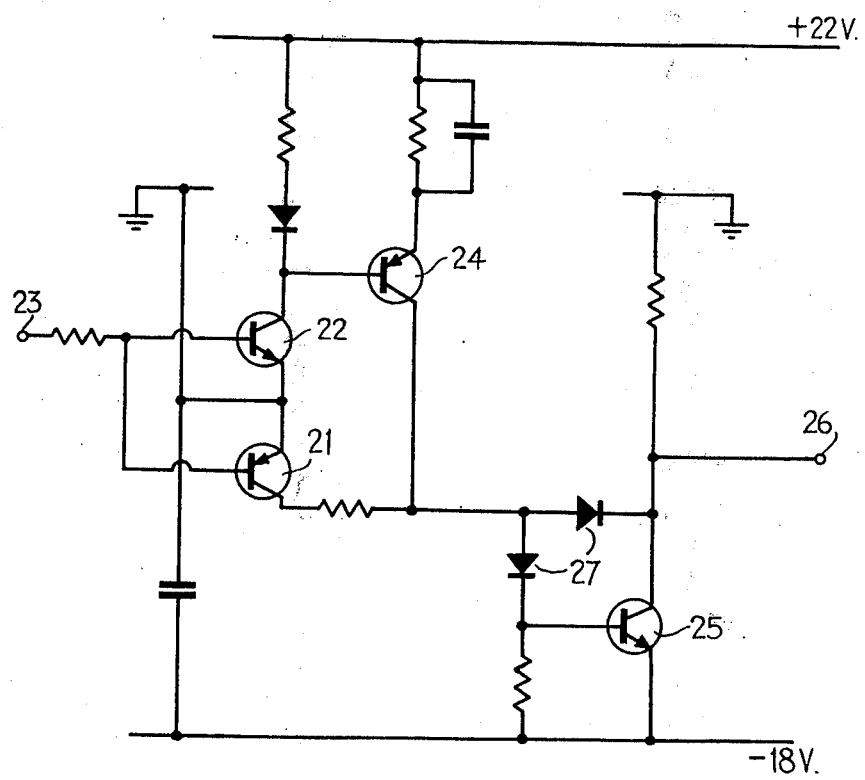

FIG. 2 shows, in block schematic form, an exemplary embodiment of A.M. signal generator r.f. level control arrangement in accordance with this invention, and FIG. 3 shows a detailed circuit diagram of the zero level crossing switch (block 16) of FIG. 2. For convenience and clarity in understanding the present invention blocks shown in FIG. 2 having counterparts in the forementioned FIG. 1 have been given like reference numerals.

Referring to FIG. 1, a variable r.f. source 1 is arranged to apply a carrier signal to a P.I.N. diode amplitude modulator 2, the modulating signal to the modulator being supplied by an audio frequency source 3. The modulated wave output from the modulator 2 is applied to a variable gain amplifier 4 and thence for utilisation at terminal 5 and also to a feedback loop comprising a broadband detector 6 which includes a rectifier and a filter to remove the r.f. carrier signal, a low pass filter 7 and a voltage comparator 8. The low pass filter 7 is designed to attenuate the audio signal component of the feedback signal but its cut-off frequency is invariably a compromise between levelling speed, unacceptable amplitude distortion and phase shift. The output of the filter 7 is compared with a D.C. reference voltage source 9 in the comparator 8 and a difference signal is applied to control the gain of the amplifier 4.

The present invention seeks to provide an A.M. signal generator having an r.f. output level control in which the compromises introduced by the low pass filter are substantially mitigated.

According to this invention an A.M. signal generator having an r.f. level control arrangement includes a variable modulation means for producing an A.M. wave whose level is to be stabilised, a detector means for detecting said A.M. wave, means for sampling and storing the output of said detector means at times occurring when the modulating wave passes through a predetermined amplitude level, and a comparator means for comparing the sampled and stored output with a reference D.C. voltage and arranged to apply the resultant of said comparison to the modulation means in opposite fashion to variation in the level of the A.M. wave about said predetermined amplitude level.

Preferably the predetermined amplitude level is a mean level of the modulating wave and zero level crossing means are provided to trigger the means for sampling and storing at times when the modulating wave passes through a zero such that the instantaneous level of the carrier wave is stored. Preferably the means for sampling is a FET operated as a switch and the store is a capacitor.

Conveniently the zero level crossing means comprise a long-tailed pair configuration of opposite conductivity type transistors arranged such that each conducts on alternate half cycles of the modulating wave, a further transistor having its base-collector junction connected across the output of the long tailed pair of transistors and being of opposite conductivity type to the transistor of the long tailed pair to which its base is connected, the combination of transistors being such that full wave rectification of the modulating wave is provided. In operation the rectified modulating wave is employed to operate the means for sampling such that sampling occurs only when the wave is at a zero (null).

Preferably the variable modulation means comprises the series connection of a source of variable frequency, a modulator having one input connected to the source of variable frequency and a further input connected to a modulating source, and a variable gain amplifier arranged to be controlled by the comparator means to effect said level control.

In accordance with a feature of this invention a method of stabilising the output amplitude of an A.M. signal generator having a modulating means for modulating an r.f. carrier wave and a variable gain amplifier controlling the output level of the modulating means at an output point of said mounting means includes the step of adjusting said variable gain amplifier by a feedback loop in dependence upon the values of samples taken at the output point when the amplifier modulating wave is at a predetermined value.

Referring to FIG. 2, the detected output from the detector 6 consisting of the detected modulating wave (audio) mixed with a D.C. component due to the detector characteristic is applied to a sampling switch 15 which in practice will normally be an electronic switch such as a field effect transistor (FET). The switch 15 is controlled by a zero level crossing switch 16 connected to the modulating frequency source 3 so as to produce pulses which close the switch 15 whenever the modulating wave passes through a mean, i.e. zero, level, the switch 15 remaining open when the modulating wave is non-zero. The sampled, substantially instantaneous, detected output corresponds to the wanted mean level at the instant when the modulating (audio) voltage passes through zero and this sampled voltage is stored on a capacitor 17, having one of its electrodes connected to earth potential, and compared with the reference d.c. potential from the source 9 by the comparator 8 which drives the variable gain amplifier 4 in opposite fashion to variation in the level of the A.M. from its mean amplitude level.

Referring to FIG. 3 the zero level crossing switch shown therein comprises an emitter coupler long tailed pair of opposite conductivity type transistors 21, 22 each of which conducts on alternate half cycles of the modulating wave applied to terminal 23 so that when transistor 21 is conducting transistor 22 is cut-off. A further transistor 24 of opposite conductivity type to transistor 22 is connected with its base-collector junction across the outputs of the transistors 21 and 22 and is such that it is conductive when transistor 22 is conductive. It will be realized by those skilled in the art that neither of the transistors 21 or 22 will conduct when the modulating wave passes through a zero so that the modulating wave is fully rectified with nulls produced where the modulating wave passes through zero level. This fully rectified wave is applied to an N.P.N. transistor 25 which switches off to produce an output pulse to terminal 26 (which is operatively connected to the sampling switch 15) to close the sampling switch 15 when the null in the fully rectified wave occurs. Thus the modulating wave is sampled at times when it crosses its zero (mean) level for a time dependent upon the switch-on/switch-off characteristics of transistors 21, 22, 24, 25 and the FET sampling switch 15. The remaining integers in this circuit are thought to be self-evident but it may be mentioned that diodes 27 are provided to prevent saturation of transistor 25 so as to speed up its turn-off time.

I claim:

1. An A.M. signal generator having an r.f. level control arrangement including a variable modulation means for producing an A.M. wave whose level is to be stabilised, a detector means for detecting said A.M. wave, means for sampling and storing the output of said detector means at instants occurring when the modulating wave passes through a predetermined amplitude level, and a comparator means for comparing the sampled and stored output with a reference D.C. voltage and arranged to apply the resultant of said comparision to the modulation means in opposite fashion to variation in the level of the A.M. wave about said predetermined amplitude level.

2. An A.M. signal generator as claimed in claim 1 wherein the predetermined amplitude level is a mean level of the modulating wave and zero level crossing means are provided to trigger the means for sampling and storing at times when the modulating wave passes through a zero such that the instantaneous level of the carrier wave is stored.

3. An A.M. signal generator as claimed in claim 2 wherein the means for sampling is a FET operated as a switch and the store is a capacitor.

4. An A.M. signal generator as claimed in claim 3 wherein the zero level crossing means comprise a long-tailed pair configuration of opposite conductivity type transistors arranged such that each conducts on alternate half cycles of the modulating wave, a further transistor having its base-collector junction connected across the output of the long tailed pair of transistors and being of opposite conductivity type to the transistor of the long tailed pair to which its base is connected, the combination of transistors being such that full wave rectification of the modulating wave is provided.

5. An A.M. signal generator as claimed in claim 4 wherein the rectified modulating wave is employed to operate the means for sampling such that sampling occurs only when the wave is at a zero (null).

6. An A.M. signal generator as claimed in claim 5 wherein the variable modulation means comprises the series connection of a source of variable frequency, a modulator having one input connected to the source of variable frequency and a further input connected to a modulating source, and a variable gain amplifier arranged to be controlled by the comparator means to effect said level control.

7. A method of stabilizing the output amplitude of an A.M. signal generator having a modulating means for modulating an R.F. carrier wave and a variable gain amplifier controlling the output level of the modulating means at an output point of said modulating means including the steps of detecting the modulated R.F. carrier wave at said output point, sampling the detected signal at instants when the modulating wave passes through a predetermined amplitude level, storing said sampled signal, comparing the stored signals with a reference d.c. voltage, and applying the resultant of the comparator to the modulation means in opposite fashion to variation in the level of the A.M. wave about said predetermined amplitude level.

8. In an A.M. signal generator including an r.f. source, an A.F. source having an output which varies about a predetermined amplitude level, and modulator means connected to said r.f. source and to said A.F. source for producing an A.M. wave whose level is to be stabilized with respect to said predetermined amplitude level, the combination of:

detector means connected to the output of said modulator means for detecting said A.M. wave;

sample and hold means connected to the output of said A.F. source and to the output of said detector means for sampling the instantaneous values of said detected A.M. wave at the instants at which said output of the A.F. source passes through said predetermined amplitude level and for holding such instantaneous values between said instants;

a D.C. reference voltage source; and means for comparing the output of said D.C. reference voltage source with the instantaneous values of said detected A.M. wave held by said sample and hold means to produce a different output, said difference output being applied to said modulator means in opposite fashion to variation in the level of the A.M. wave about said predetermined amplitude level.

9. In an A.M. signal generator as defined in claim 8 wherein said sample and hold means includes a zero level crossing switch connected to the output of said A.F. source and a sampling switch controlled by said zero level crossing switch.

* * * * *